(12) United States Patent
Wexler

(10) Patent No.: US 7,511,501 B2
(45) Date of Patent: Mar. 31, 2009

(54) SYSTEMS AND APPARATUS FOR MONITORING INTERNAL TEMPERATURE OF A GRADIENT COIL

(75) Inventor: Eugene Wexler, Florence, SC (US)

(73) Assignee: General Electric Company, Schenectady, NY (US)

(*) Notice: Subject to any disclaimer, the term of this patent is extended or adjusted under 35 U.S.C. 154(b) by 175 days.

(21) Appl. No.: 11/747,747

(22) Filed: May 11, 2007

(65) Prior Publication Data
US 2008/0278175 A1 Nov. 13, 2008

(51) Int. Cl.
*G01R 31/06* (2006.01)
(52) U.S. Cl. ......................... 324/318; 374/142
(58) Field of Classification Search ............. 374/141, 374/152, 142; 324/318
See application file for complete search history.

(56) References Cited

U.S. PATENT DOCUMENTS

| | | | |
|---|---|---|---|
| 6,774,631 B2 * | 8/2004 | Heid | 324/318 |
| 6,992,483 B1 * | 1/2006 | Emeric et al. | 324/300 |
| 7,135,863 B2 * | 11/2006 | Arik et al. | 324/318 |
| 7,301,343 B1 * | 11/2007 | Sellers | 324/318 |
| 2002/0148604 A1 * | 10/2002 | Emeric et al. | 165/206 |
| 2004/0017195 A1 * | 1/2004 | Kassai et al. | 324/315 |
| 2004/0064031 A1 * | 4/2004 | Dean et al. | 600/410 |
| 2005/0040826 A1 * | 2/2005 | Renz et al. | 324/318 |
| 2005/0148845 A1 * | 7/2005 | Dean et al. | 600/407 |
| 2006/0066309 A1 * | 3/2006 | Arik et al. | 324/318 |
| 2007/0080689 A1 * | 4/2007 | Konijn et al. | 324/318 |
| 2008/0088311 A1 * | 4/2008 | Nakabayashi et al. | 324/320 |
| 2008/0297153 A1 * | 12/2008 | Nozaki | 324/309 |

FOREIGN PATENT DOCUMENTS

| | | |
|---|---|---|
| JP | 04176440 A | 6/1992 |
| JP | 05212012 A | 8/1993 |
| JP | 08322815 A | 12/1996 |

* cited by examiner

*Primary Examiner*—Andre J Allen
(74) *Attorney, Agent, or Firm*—Peter Vogel, Esq.; Jean Tibbetts, Esq; Michael G. Smith, Esq.

(57) ABSTRACT

Systems, methods and apparatus are provided through which in some embodiments a thermal sensor of a magnetic coil of a magnetic resonance imaging system (MRI) is positioned, placed and/or mounted externally to the magnetic coil. The external placement of the thermal sensor does not require replacement of the entire magnetic coil, yielding less expensive replacement of a failed thermal sensor.

20 Claims, 11 Drawing Sheets

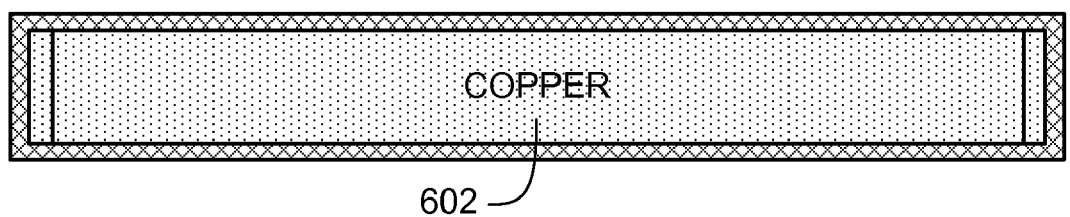
FIG. 6
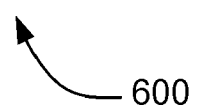

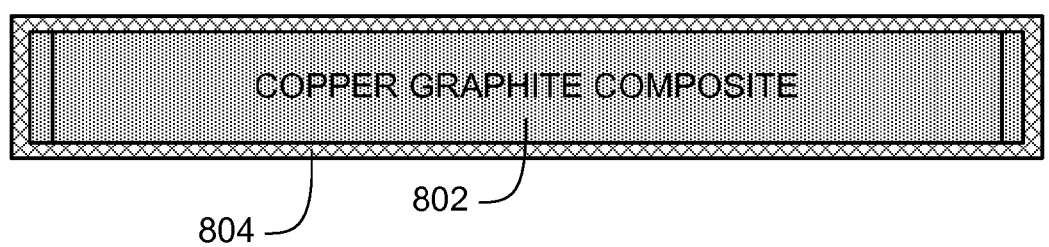
804 802
FIG. 8
800

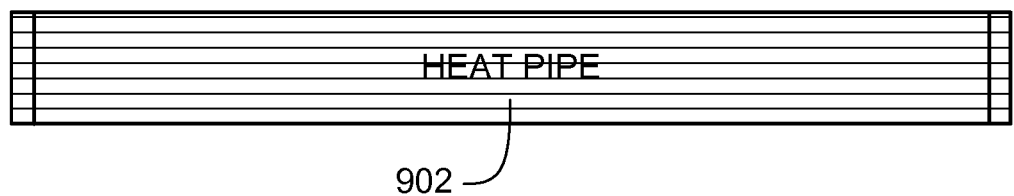
FIG. 9
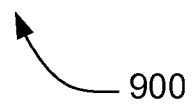

SYSTEMS AND APPARATUS FOR MONITORING INTERNAL TEMPERATURE OF A GRADIENT COIL

FIELD OF THE INVENTION

This invention relates generally to thermal sensing, and more particularly to monitoring the internal temperature of a magnetic resonance imaging system.

BACKGROUND OF THE INVENTION

Magnetic resonance imaging (MRI) systems include magnetic coils (e.g., gradient coils) that are energized by electricity. During a patient scan, operation of the magnetic coils generate large amounts of heat, for example, pulsing of the gradient coils to generate gradient magnetic fields results in the dissipation of heat and the temperature of the gradient coils increases. Under normal operating conditions, the heat produced by the magnetic coils is removed by providing appropriate cooling. For example, the heat can be removed by liquid filled cooling tubes positioned at a given distance from the heat conductors. A liquid coolant, such as water or ethylene, absorbs heat from the gradient coils as it is circulated through the cooling tubes and transports the heat to a remote heat exchanger/water chiller. Heat can then be ejected to the atmosphere by way of the heat exchanger/chiller. This allows maintaining the temperature of the coil at a certain safe level.

An increase in internal temperature of the magnetic coils in excess of an allowable temperature limit is indicative of a possible coil malfunction. In the case of malfunctioning (e.g., if the cooling fails or the power increases), excessive heat can be generated. As a result, the internal temperature can increase rapidly which can lead to accelerated material degradation of the magnetic coil and, ultimately, overheating of the patient which can cause harm to the patient. The heat can also reduce the mean-time-between failure of devices in the MRI system and possibly damage the MRI magnetic coil or even cause failure of the magnetic coil. Accordingly, the temperature of the magnetic coils is monitored.

In conventional MRI systems, the magnetic coil temperature can be monitored using thermal (temperature) sensors that are installed, inserted or mounted inside the body of the magnetic coil. Accordingly, the thermal sensor is internal to the magnetic coil. When a conventional thermal sensor of an MRI magnetic coil fails, however, replacing only the failed thermal sensor can be difficult. Typically, to replace a failed thermal sensor in the MRI magnetic coils, the entire coil must be replaced. Therefore, failure of even one thermal sensor can compromise the entire magnetic coil. The cost of replacement of an MRI magnetic coil can be large and include the cost of the materials and labor and the cost to an MRI facility of obtaining MRI services from other facilities while the MRI system is inoperable.

For the reasons stated above, and for other reasons stated below which will become apparent to those skilled in the art upon reading and understanding the present specification, there is a need in the art for easier and less expensive replacement of the thermal sensors of MRI magnetic coils.

BRIEF DESCRIPTION OF THE INVENTION

In accordance with an embodiment, an apparatus for monitoring internal temperature of a gradient coil includes a thermally conductive device having a first end and a second end, the first end positioned inside the gradient coil and the second end positioned outside the gradient coil and a thermal sensor thermally coupled to the second end of the thermally conductive device external to the gradient coil.

In accordance with another embodiment, a system for monitoring internal temperature of a gradient coil includes at least one temperature monitoring apparatus including a thermally conductive device having a first end and a second end, the first end positioned inside the gradient coil and the second end positioned outside of the gradient coil and a thermal sensor thermally coupled to the second end of the thermally conductive device external to the gradient coil. The system also includes a control computer coupled to the thermal sensor and configured to receive signals from the thermal sensor.

In accordance with another embodiment, a magnetic resonance imaging system includes a gradient coil and a plurality of thermal monitoring devices where each thermal monitoring device includes a thermally conductive device having a first end and a second end, the first end positioned inside the gradient coil and the second end positioned outside of the gradient coil and a thermal sensor thermally coupled to the second end of the thermally conductive device external to the gradient coil. The system also includes a control computer coupled to at least one of the plurality of thermal monitoring devices and configured to receive signals from the at least one thermal monitoring device.

BRIEF DESCRIPTION OF THE DRAWINGS

Embodiments of the invention will become more fully understood from the following detailed description, taken in conjunction with the accompanying drawings, wherein like reference numerals refer to like parts, in which:

FIG. 6 is a cross section block diagram of a thermally conductive device, according to an embodiment;

FIG. 8 is a cross section block diagram of a thermally conductive device, according to an alternative embodiment;

FIG. 9 is a cross section block diagram of a heat pipe thermally conductive device, according to an embodiment;

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

A thermal sensor for monitoring the internal temperature of a gradient coil of a magnetic resonance imaging (MRI) system is positioned, placed and/or mounted externally to the gradient coil. The thermal sensor is thermally coupled to the gradient coil via a thermally conductive device having a first and a second end. The first end of the thermally conductive device is inserted into an end of the gradient coil in, for example, an axial direction. The thermal sensor is coupled to the second end of the thermally conductive device that is external to the gradient coil. Accordingly, if the thermal sensor fails, the externally placed thermal sensor may be replaced without having to replace the entire gradient coil. Accordingly, the system and apparatus described herein solves the need in the art for easier and less expensive replacement of thermal sensors of MRI gradient coils. Placement of the thermal sensors external to the gradient coil improves the reliability and serviceability of a gradient coil while still allowing for the monitoring of the internal gradient coil temperature. In addition, implementation of the thermally conductive devices may improve the overall temperature homogeneity in the portions of the gradient coil where the thermally conductive devices are installed. While the embodiments described herein are described in terms of a MRI gradient coil, the systems and apparatus may be implemented in other systems where temperature monitoring is required and/or where direct installation of thermal sensors is problematic.

Figure 1:
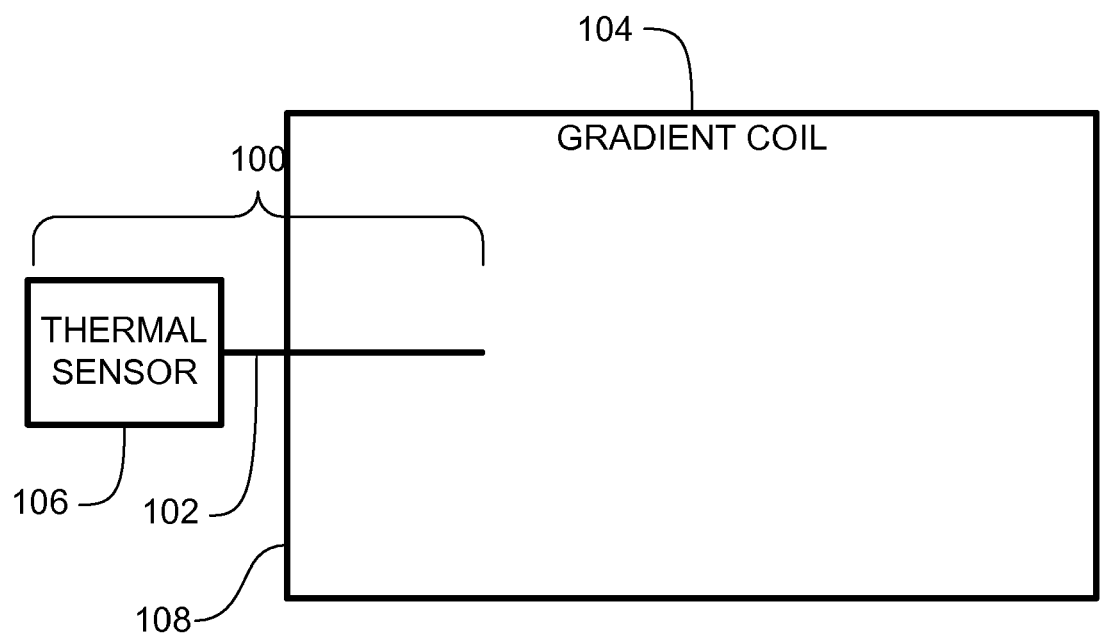
FIG. 1 is a schematic block diagram of an apparatus for monitoring internal temperature of a gradient coil in accordance with an embodiment.

FIG. 1 is a schematic block diagram of an apparatus for monitoring internal temperature of a gradient coil in accordance with an embodiment. Apparatus 100 (also referred to herein as a temperature monitoring apparatus or thermal monitoring device) includes a thermally conductive device 102 and a thermal sensor 106. Thermally conductive device (or strap or insert) 102 is operable to thermally couple to a gradient coil 104. The thermal sensor 106 is positioned externally to the gradient coil and is thermally coupled to the thermally conductive device 102. The thermal sensor 106 may be a thermal or temperature sensing device including, but not limited to, a thermistor or a thermocouple. While the apparatus 100 is not limited to any particular thermally conductive device 102, gradient coil 104 and thermal sensor 106, for the sake of clarity a simplified thermally conductive device 102, gradient coil 104 and the thermal sensor 106 are described. In an embodiment, more than one (not shown) thermal sensor 106 may be coupled to the same thermally conductive device 102, for example, for redundancy purposes.

Figure 2:
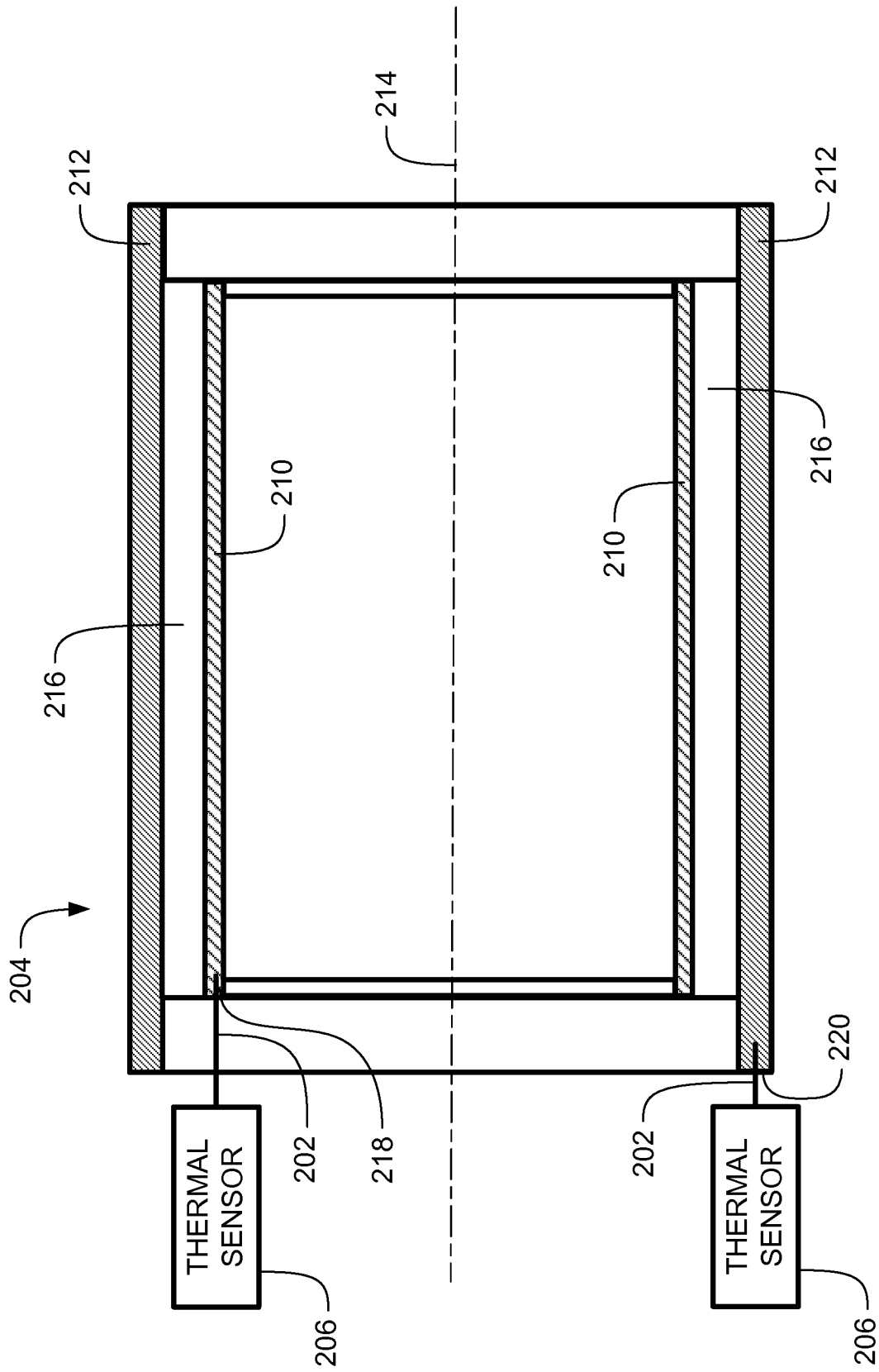
FIG. 2 is a sectional view, taken in a plane through a central longitudinal axis, of an exemplary cylindrical shielded gradient coil assembly in accordance with an embodiment.

A portion or section of thermally conductive device 102 is inserted (or embedded) in an end 108 of gradient coil 104. Gradient coil 104 may be, for example, a cylindrical shielded gradient coil assembly as shown in FIG. 2. While a shielded cylindrical gradient coil is described below, it should be understood that the system and apparatus for monitoring the internal temperature of a gradient coil may also be used with other gradient coil topologies.

FIG. 2 is a sectional view, taken in a plane through a central longitudinal axis, of an exemplary shielded gradient coil assembly in accordance with an embodiment. Gradient coil assembly 204 is cylindrical and annular in shape and may be used, for example, in a magnet assembly of a magnetic resonance imaging (MRI) system. Gradient coil assembly 204 comprises a cylindrical inner gradient coil assembly or winding 210 and a cylindrical outer gradient coil assembly or winding 212 disposed in concentric arrangement with respect to a common axis 214. Various other elements such as supports, suspension members, end rings, brackets, etc. are omitted from FIG. 2 for clarity.

Inner gradient coil assembly 210 includes coils of X-, Y- and Z-gradient coils and outer gradient coil assembly 212 includes the respective outer coils of the X-, Y- and Z-gradient coils. The coils of gradient coil assembly 204 may be activated by passing an electric current through the coils to generate a gradient magnetic field. A volume 216 of space between inner gradient coil assembly 210 and outer gradient coil assembly 212 may be filled with a bonding material, e.g., an epoxy resin, visco-elastic resin, polyurethane, etc. Alternatively, an epoxy resin with filler material such as glass beads, silica and alumina may be used as the bonding material.

As mentioned, a thermally conductive device 102 (shown in FIG. 1) may be inserted in an end of the gradient coil 204 and used to thermally couple a thermal sensor 106 (shown in FIG. 1) to the gradient coil 204. For the gradient coil shown in FIG. 2, a thermally conductive device 202 may be inserted in an end 220 of the outer gradient coil assembly 212 and a thermal sensor 206 coupled the thermally conductive device 202. Alternatively (or additionally), a thermally conductive device 202 may be inserted into an end 218 of the inner gradient coil assembly 210 and a thermal sensor 206 coupled to the thermally conductive device 202. Placement of a thermally conductive device or devices in the inner gradient coil assembly 210 allows monitoring of the gradient coil temperature closer to the patient.

Thermally conductive device 202 thermally couples the thermal sensor 206 to the gradient coil 204 so that the thermal sensor 206 may measure and/or monitor an internal temperature of the gradient coil 204.

Figure 3:
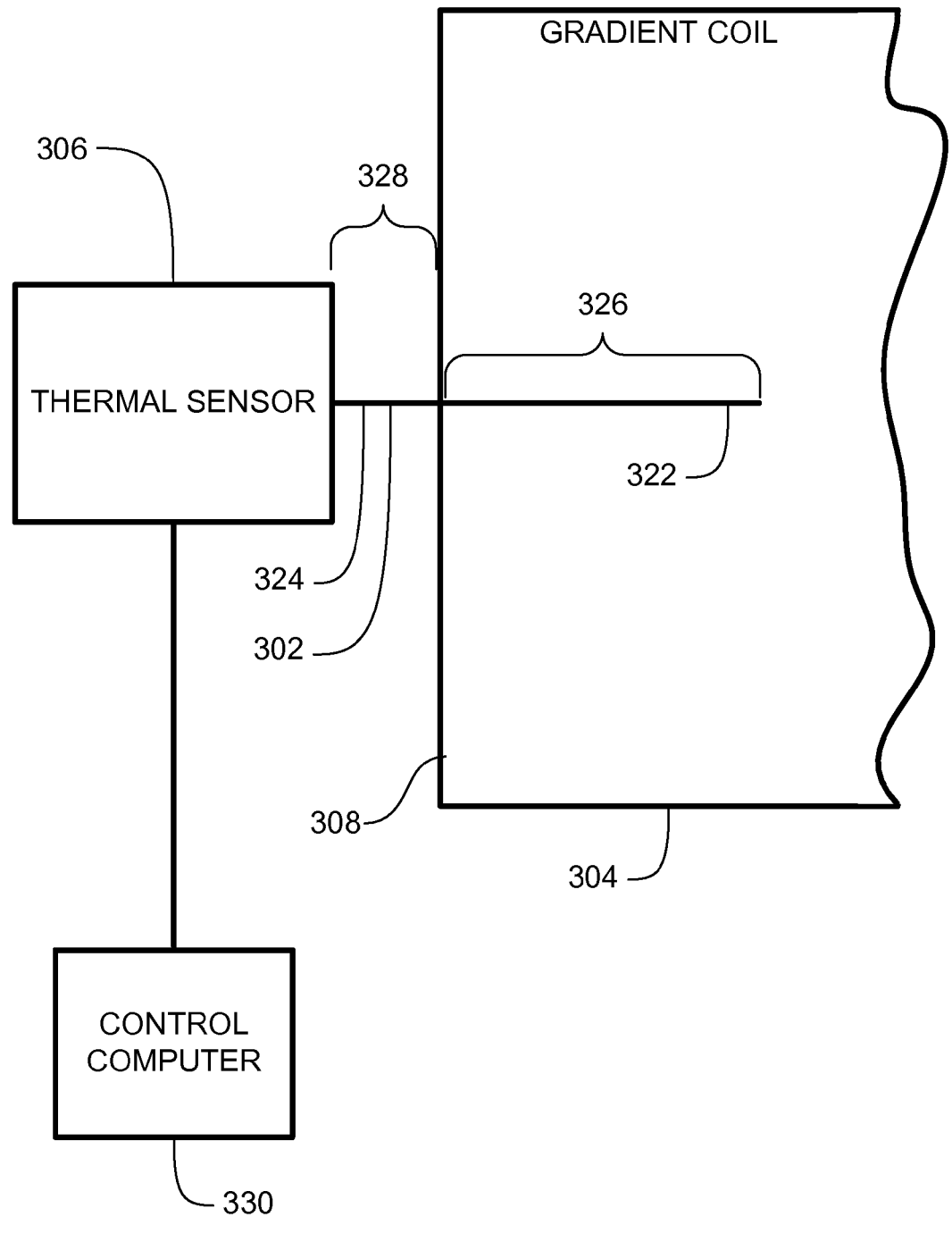
FIG. 3 is a schematic block diagram of apparatus for monitoring internal temperature of a gradient coil, according to an embodiment.

FIG. 3 is a schematic block diagram of an apparatus for monitoring internal temperature of a gradient coil, according to an embodiment. Apparatus 300 includes a thermally conductive device 302 that has a first end 322 and a second end 324. The first end 322 of thermally conductive device 302 is inserted by a first distance 326 into an end 308 of a gradient coil 304. Preferably, the first end 322 of thermally conductive device 302 is inserted in gradient coil 304 along an axial direction. In an embodiment, thermally conductive device 302 is inserted into a service end of the gradient coil 304. Thermally conductive device 302 may be covered with fiberglass tape to hold it in place during assembly and embedded in the gradient coil 304 with epoxy. The second end 324 of thermally conductive device 302 extends by a second distance 328 beyond and past the end 308 of the gradient coil 304. A thermal sensor 306 is coupled to the second end 324 of the thermally conductive device 302 and is external to the gradient coil 304. Preferably, there is no direct physical contact between the surface of the gradient coil 304 and the thermal sensor 306. In some embodiments, the second distance 328 that the second end 324 extends beyond the surface of the end 308 of gradient coil 304 is in a range of 10 mm to 15 mm. The depth (e.g., the first distance 326) at which the thermally conductive device 302 is inserted (or embedded) into the end of gradient coil 304 may be determined based on thermal conditions specific to the gradient coil. In some embodiments, the length of the second distance 326 that the first end 322 of the thermally conductive device 302 is inserted into the gradient coil 304 is approximately 317 mm.

Thermal sensor 306 is configured to measure and/or monitor the internal temperature of the gradient coil 304. In one embodiment, thermal sensor 306 may be coupled to a control computer 330. Thermal sensor 306 may provide signals to the control computer 330 that are indicative of the internal temperature of the gradient coil 304. Control computer 330 may be configured to monitor internal temperature of the gradient coil 304 as provided by the thermal sensor 306 and cause actions in response to the internal temperature of the gradient coil 304. The actions may include, but are not limited to, triggering a system alarm or emergency shut off if the internal temperature exceeds a predetermined temperature limit. Control computer 330 may be, for example, a general purpose computing device in the form of a computer, including a processing unit, a system memory, and a system bus that couples various system components including system memory to the processing unit. The system memory may include read only memory (ROM) or random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD ROM or other optical media. The drives and their associated machine-readable media provide nonvolatile storage of machine-executable instructions, data structures, program modules and other data for the computer.

Figure 4:
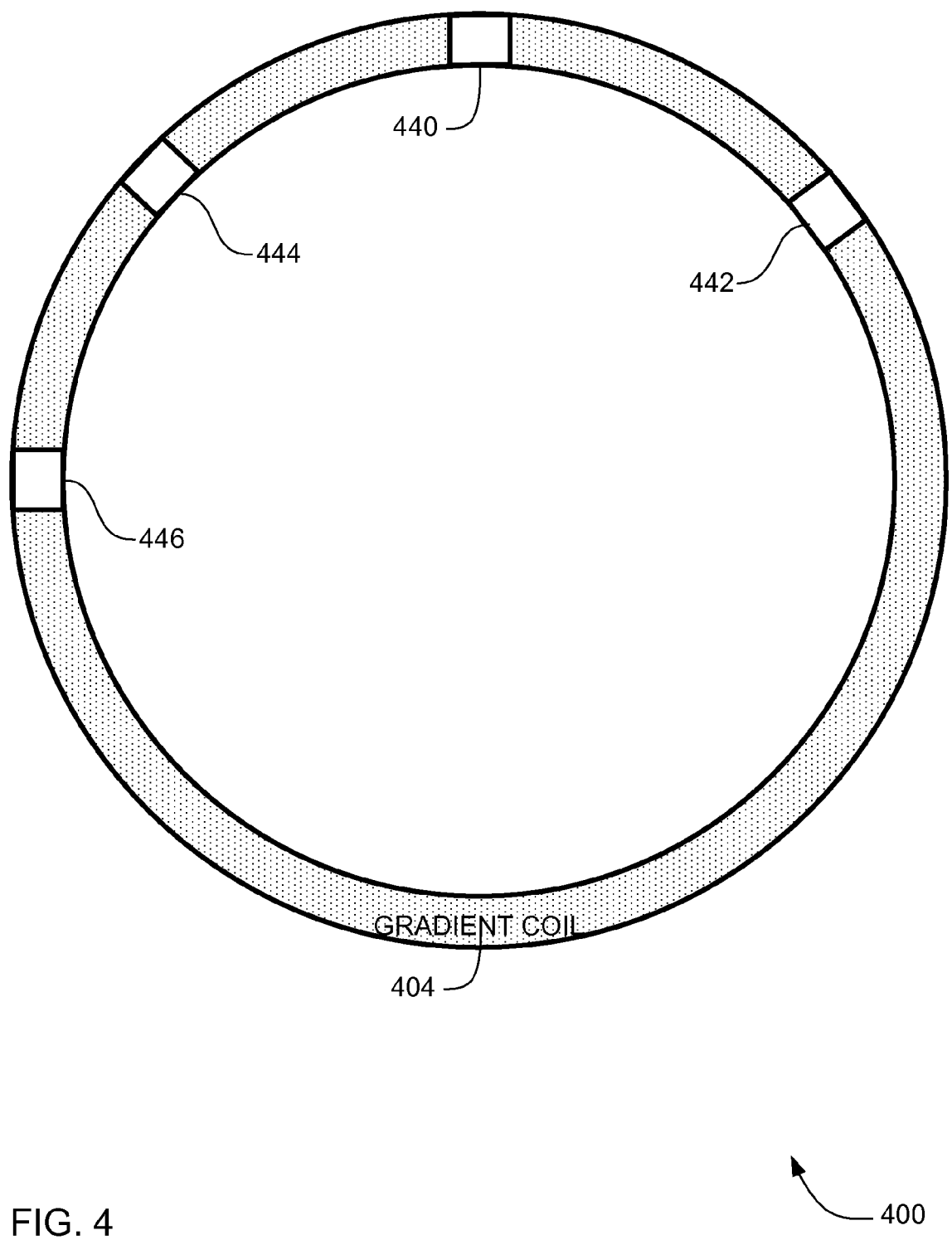
FIG. 4 is a schematic block diagram of a system for monitoring internal temperature of a gradient coil, according to an embodiment.

A plurality of thermal sensors 306 may be thermally coupled to gradient coil 304 via corresponding thermally conductive devices 302. FIG. 4 is a schematic block diagram of a system for monitoring internal temperature of a gradient coil, according to an embodiment. FIG. 4 shows an end of a cylindrical gradient coil 404 and illustrates placement of a plurality of thermal sensors 440, 442, 444 and 446 around a circumference of the end of the gradient coil 404 cylinder. Gradient coil 404 may include an inner coil assembly (not shown) and an outer coil assembly (not shown) as described above with respect to FIG. 2.

FIG. 4 shows four thermal sensors 440, 442, 444 and 446. Each of the thermal sensors 440, 442, 444 and 446 is external to the gradient coil 404 and coupled to a corresponding thermally conductive device (not shown) such as thermally conductive device 302 (shown in FIG. 3). As discussed above, each thermally conductive device is inserted into the gradient coil 404 and acts to thermally couple the corresponding thermal sensor to gradient coil 404. While four thermal sensors are shown in FIG. 4, it should be understood that fewer or more thermal sensors can be used. The dimensions of the gradient coil 404 and the thermal sensors 440, 442, 444 and 446 are not limiting. The dimensions shown in FIG. 4 are provided only for ease of understanding of the user. The thermal sensors 440, 442, 444 and 446 may be coupled to a control computer, such as control computer 330 described above with respect to FIG. 3.

The position (e.g., the angular distribution) of the thermal sensors 440, 442, 444 and 446 and each corresponding thermally conductive device may be determined based on thermal conditions specific to the gradient coil 404. For example, the thermal sensors 440, 442, 444 and 446 may be positioned at radial positions that are associated with "hot spots" in the gradient coil 404.

Figure 5:
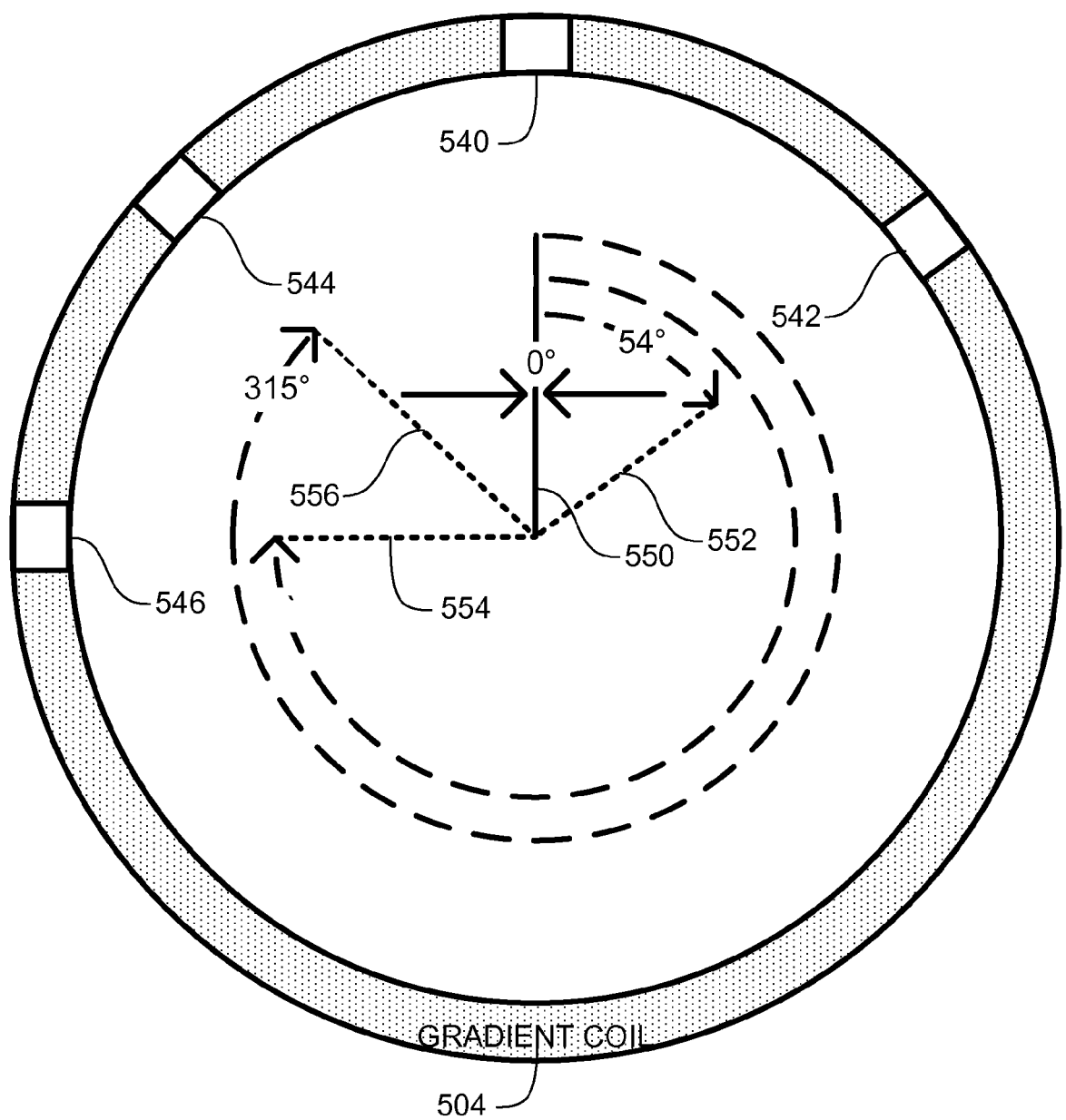
FIG. 5 is a schematic block diagram of a system for monitoring the internal temperature of a gradient coil wherein thermal sensors are positioned at exemplary radial positions that are associated with hot spots in the gradient coil, according to an embodiment.

FIG. 5 is a schematic block diagram of a system for monitoring internal temperature of a gradient coil, illustrating an exemplary placement of a plurality of thermal sensors, according to an embodiment. In FIG. 5, exemplary "hot spot" locations are at radial positions of 00, 540, 2700 and 3150. Each thermal sensor 540, 542, 544 and 546 and a corresponding thermally conductive device (not shown) are positioned at one of the hot spots. A first thermal sensor 540 and thermally conductive device are positioned at the top of the gradient coil 504 at the 0 degree position 550. A second thermal sensor 542 and thermally conductive device are positioned at approximately 54 degrees 552 from the top of gradient coil 504. A third thermal sensor 546 and a thermally conductive device are positioned at approximately 270 degrees 554 from the top of gradient coil 504. A fourth thermal sensor 544 and thermally conductive device are positioned at approximately 315 degrees 556 from the top of gradient coil 504. The radial position of the thermal sensors shown in FIG. 5 is one example of placement of the thermal sensors. The thermal sensors (and thermally conductive devices) may be placed at other positions, for example, as mentioned above, at positions determined based on thermal conditions specific to the gradient coil 504.

Returning to FIG. 3, as mentioned, thermally conductive device 302 thermally couples a thermal sensor 306 to the gradient coil 304. Thermally conductive device 302 is fabricated from a material that is capable of heat transfer/conductivity so that a local change in the internal temperature of the gradient coil 304 near the first end 322 results in a temperature change on the second end 324 that may be detected by thermal sensor 306. The thermal response time of the thermally conductive device 302 depends on the thermal diffusivity of the material and the length of the heat transfer path. Preferably, the material for thermally conductive device 302 has high thermal conductivity and high thermal diffusivity and may include, but is not limited to, copper, copper graphite composites and advanced pyrolitic graphite. Alternatively, thermally conductive device 302 may be a heat pipe.

Figure 7:
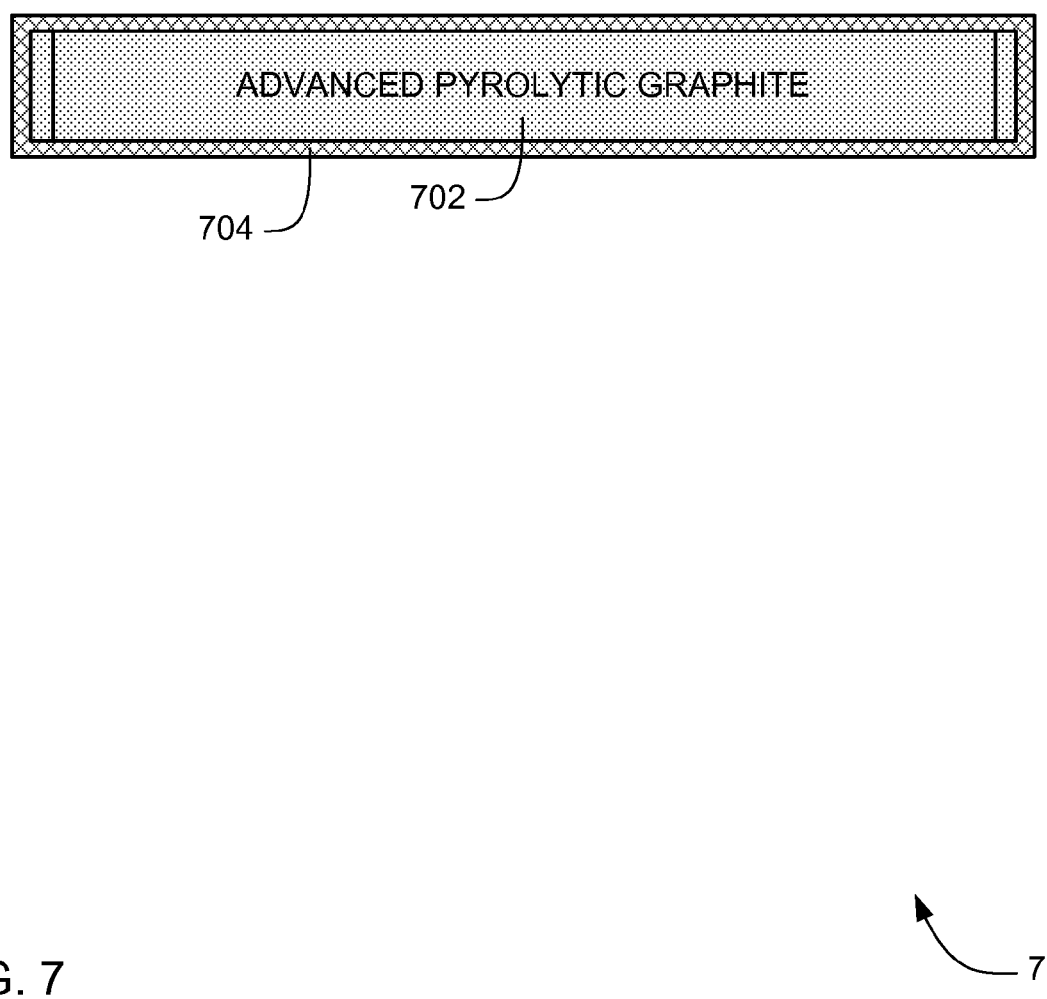
FIG. 7 is a cross section block diagram of thermally conductive device, according to an alternative embodiment.

FIG. 6 is a cross section block diagram of thermally conductive device, according to an embodiment. Thermally conductive device 600 includes a copper material 602 that has a thermal diffusivity of approximately $117 \times 10^{-6}$ m$^2$/s. FIG. 7 is a cross section block diagram of thermally conductive device, according to an alternative embodiment. Thermally conductive device 700 includes an advanced pyrolitic graphite material 702. Advanced pyrolitic graphite is an anisotropic material with in-plane thermal conductivity of the order of 1700 W/m K and density of about 2300 kg/cu.m. The thermal diffusivity of advanced pyrolitic graphite is approximately $1040 \times 10^{-6}$ m$^2$/s. As a result of the high thermal diffusivity, the advanced pyrolitic graphite enables quick heat transfer in the axial direction. In some embodiments, the advanced pyrolytic graphite material 702 includes anisotropic advanced pyrolytic graphite, such as advanced pyrolytic graphite manufactured by K Technology Corporation at 2000 Cabot Boulevard West, Langhorne, Pa. The advanced pyrolytic graphite material 702 may be encased in an encapsulate 704 to simplify handling.

FIG. 8 is a cross section block diagram of a thermally conductive device, according to an alternative embodiment. The thermally conductive device 800 includes a copper-graphite composite material 802. Preferably, the copper-graphite composite material 802 has increased thermal conductivity in the axial direction. The copper-graphite material 802 can be encased in an encapsulate 804.

FIG. 9 is a cross section block diagram of a heat pipe—based thermal conductive device, according to an embodiment. The thermally conductive device or heat pipe 900 includes a heat pipe casing 902. In an embodiment, the heat pipe 900 includes a cooling device (not shown) that is thermally coupled to the heat pipe 900.

Figure 10:
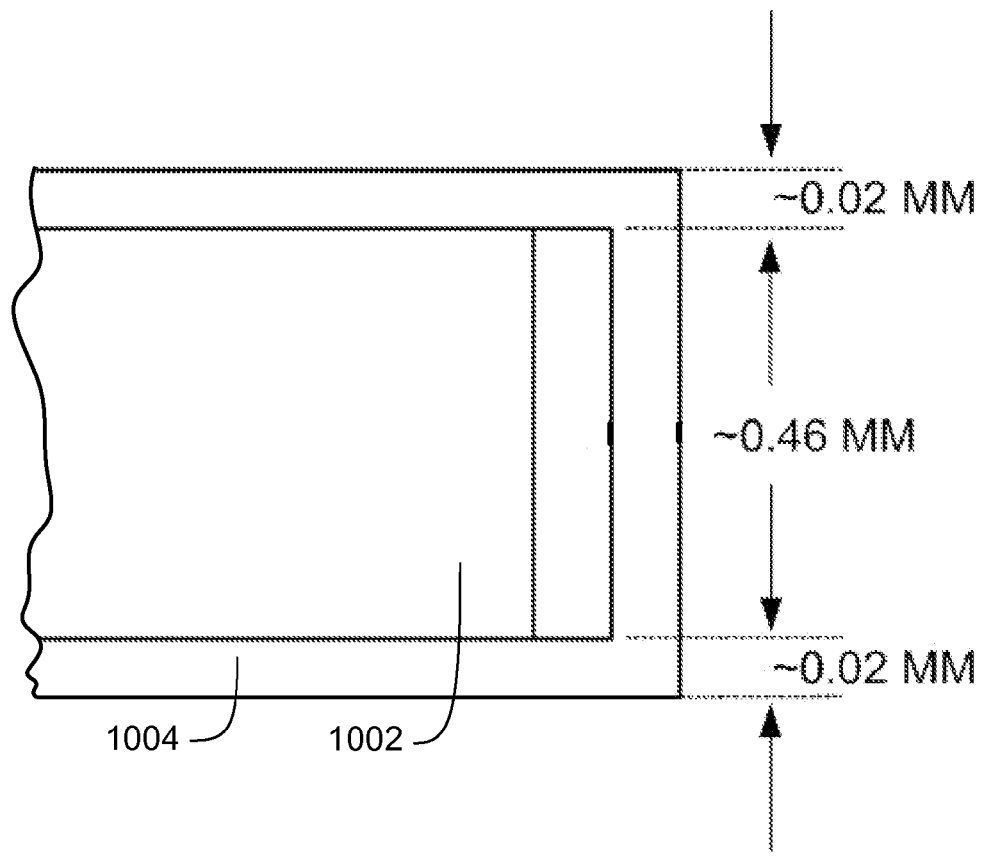
FIG. 10 is a cross section block diagram of one end of a thermally conductive device having exemplary specific dimensions, according to an embodiment.

FIG. 10 is a cross section block diagram of one end of a thermally conductive device having exemplary specific dimensions, according to an embodiment. Apparatus 1000 includes a thermally conductive material 1002 that is about 0.46 millimeters (mm) thick and in which the encapsulate 1004 is approximately 0.020 mm thick, in which case the thermally conductive device 1000 is about 0.50 mm thick.

The proportions of the dimensions of the apparatus and devices, such as the thermally conductive device, the gradient coil, and the thermal sensors are not limiting. The proportions of the dimensions shown in the figures are provided only for ease of understanding of the reader.

Figure 11:
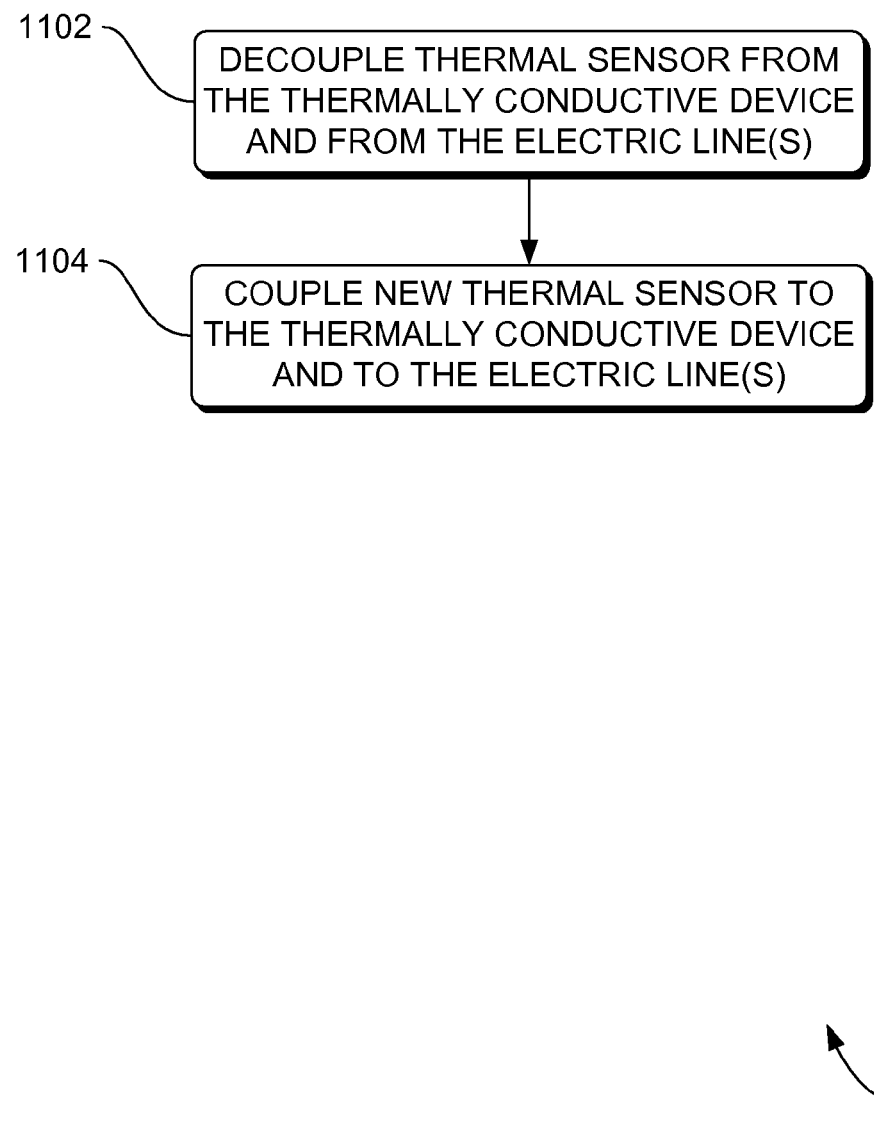
FIG. 11 is a flowchart of a method to replace a thermal sensor of an MRI system, according to an embodiment.

FIG. 11 is a flowchart of a method to replace a thermal sensor of a MRI system, according to an embodiment. At block 1102, a thermal sensor is decoupled from a thermally conductive device and decoupled from an electric line. The thermal sensor and the thermally conductive device may be any one of the thermal sensors and the thermally conductive devices described above in conjunction with FIGS. 1-10. The electric line can operably couple the thermal sensor to a computing device that provides automated monitoring and alarms of the thermal sensor.

At block 1104, a new thermal sensor is coupled to the thermally conductive device and coupled to the electric line. The coupling and decoupling of the thermal sensor may be quick and easy as a result of the thermal sensor being external to the gradient coil. Replacement of the thermal sensor does not require replacement of the gradient coil.

Although specific embodiments are illustrated and described herein, it will be appreciated by those of ordinary skill in the art that any arrangement which is calculated to achieve the same purpose can be substituted for the specific embodiments shown. This application is intended to cover any adaptations or variations. For example, although described in terms of magnetic resonance imaging (MRI) systems, one of ordinary skill in the art will appreciate that implementations can be made in other devices that require monitoring of temperature.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future MRI systems, different gradient coils, and new thermal sensors.

The terminology used in this application meant to include all environments and alternate technologies which provide the same functionality as described herein

I claim:

1. An apparatus for monitoring internal temperature of a gradient coil, the apparatus comprising:
    a thermally conductive device having a first end and a second end, the first end positioned inside the gradient coil and the second end positioned outside the gradient coil; and
    a thermal sensor thermally coupled to the second end of the thermally conductive device external to the gradient coil.

2. An apparatus according to claim 1, wherein the first end of the thermally conductive device is positioned inside an end of the gradient coil in an axial direction.

3. An apparatus according to claim 1, wherein the thermally conductive device comprises a copper material.

4. An apparatus according to claim 1, wherein the thermally conductive device comprises advanced pyrolitic graphite.

5. An apparatus according to claim 1, wherein the thermally conductive device comprises a copper-graphite composite.

6. An apparatus according to claim 1, wherein the thermally conductive device comprises a heat pipe.

7. An apparatus according to claim 1, further comprising a second thermal sensor thermally coupled to the second end of the thermally conductive device external to the gradient coil.

8. A system for monitoring internal temperature of a gradient coil, the system comprising:
    at least one temperature monitoring apparatus comprising:
        a thermally conductive device having a first end and a second end, the first end positioned inside the gradient coil and the second end positioned outside of the gradient coil; and
        a thermal sensor thermally coupled to the second end of the thermally conductive device external to the gradient coil; and
    a control computer coupled to the thermal sensor and configured to receive signals from the thermal sensor.

9. A system according to claim 8, wherein the first end of the thermally conductive device is positioned inside an end of the gradient coil in an axial direction.

10. A system according to claim 8, further comprising a plurality of temperature monitoring apparatus.

11. A system according to claim 10, wherein the gradient coil is cylindrical and the end of the gradient coil has a circumference and each temperature monitoring apparatus is located at a position on the circumference of the end of the gradient coil.

12. A system according to claim 8, wherein the control computer is further configured to determine if a temperature of the gradient coil exceeds a predetermined temperature.

13. A system according to claim 8, wherein the temperature monitoring apparatus further comprises a second thermal sensor thermally coupled to the second end of the thermally conductive device external to the gradient coil.

14. A magnetic resonance imaging system comprising:
    a gradient coil;
    a plurality of thermal monitoring devices, each thermal monitoring device comprising:
        a thermally conductive device having a first end and a second end, the first end positioned inside the gradient coil and the second end positioned outside of the gradient coil; and
        a thermal sensor thermally coupled to the second end of the thermally conductive device external to the gradient coil; and
    a control computer coupled to at least one of the plurality of thermal monitoring devices and configured to receive signals from the at least one thermal monitoring device.

15. A magnetic resonance imaging system according to claim 14, wherein the first end of the thermally conductive device is positioned inside an end of the gradient coil in an axial direction.

16. A magnetic resonance imaging system according to claim 14, wherein the gradient coil comprises an inner gradient coil assembly and an outer gradient coil assembly.

17. A magnetic resonance imaging system according to claim 16, wherein at least one of the plurality of thermal monitoring devices is coupled to the inner gradient coil assembly.

18. A magnetic resonance imaging system according to claim 16, wherein at least one of the plurality of thermal monitoring devices is coupled to the outer gradient coil assembly.

19. A magnetic resonance imaging system according to claim 14, wherein at least one of the plurality of thermal monitoring devices further comprises a second thermal sensor thermally coupled to the second end of the thermally conductive device external to the gradient coil.

20. A magnetic resonance imaging system according to claim 14, wherein the thermally conductive device comprises advanced pyrolitic graphite.

* * * * *